(12) United States Patent
Kondo et al.

(10) Patent No.: US 9,512,534 B2
(45) Date of Patent: Dec. 6, 2016

(54) COPPER FILLING-UP METHOD

(71) Applicants: OSAKA PREFECTURE UNIVERSITY PUBLIC CORPORATION, Sakai-shi, Osaka (JP); NITTO BOSEKI CO., LTD., Fukushima (JP)

(72) Inventors: Kazuo Kondo, Sakai (JP); Takeyasu Saito, Sakai (JP); Naoki Okamoto, Sakai (JP); Masaru Bunya, Koriyama (JP); Minoru Takeuchi, Tokyo (JP)

(73) Assignees: OSAKA PREFECTURE UNIVERSITY PUBLIC CORPORATION, Sakai (JP); NITTO BOSEKI CO., LTD., Fukushima (JP)

( * ) Notice: Subject to any disclaimer, the term of this patent is extended or adjusted under 35 U.S.C. 154(b) by 315 days.

(21) Appl. No.: 13/974,113

(22) Filed: Aug. 23, 2013

(65) Prior Publication Data
US 2013/0334053 A1 Dec. 19, 2013

Related U.S. Application Data

(63) Continuation of application No. 12/782,157, filed on May 18, 2010, now abandoned.

(30) Foreign Application Priority Data

May 18, 2009 (JP) ................................. 2009-120133

(51) Int. Cl.
*C25D 5/18* (2006.01)
*H01L 21/768* (2006.01)
(Continued)

(52) U.S. Cl.
CPC . *C25D 5/18* (2013.01); *C25D 3/38* (2013.01); *H01L 21/2885* (2013.01); *H01L 21/76861* (2013.01); *H01L 21/76898* (2013.01); *H01L 21/76877* (2013.01)

(58) Field of Classification Search
CPC .......... C25D 5/02; C25D 5/022; C25D 5/18; C25D 3/38; H01L 21/76861; H01L 21/76898; H01L 21/2885; H01L 21/76877
See application file for complete search history.

(56) References Cited

U.S. PATENT DOCUMENTS 3,686,151 A 8/1972 Keim
6,736,953 B1 5/2004 Zhu et al.
(Continued)

FOREIGN PATENT DOCUMENTS

JP 2003-328180 11/2003
JP 2006-45363 A 2/2006
(Continued)

OTHER PUBLICATIONS

PAS-A-1 Product Documentation.*
(Continued)

*Primary Examiner* — Louis Rufo
(74) *Attorney, Agent, or Firm* — Nixon & Vanderhye P.C.

(57) ABSTRACT

There is provided a method of well filling copper in a conductivity-rendered non-through hole having an aspect ratio (depth/hole diameter) of 5 or more on a substrate in a short period of time, and the method comprises using an acidic copper plating bath comprising a water-soluble copper salt, sulfuric acid, chlorine ion, a brightener and a copolymer of diallylamines and sulfur dioxide and filling copper in the non-through hole by periodic current reversal copper plating.

6 Claims, 3 Drawing Sheets

(51) Int. Cl.
*C25D 3/38* (2006.01)
*H01L 21/288* (2006.01)

(56) References Cited

U.S. PATENT DOCUMENTS

| | | | |
|---|---|---|---|
| 6,946,065 B1* | 9/2005 | Mayer | C25D 3/02 205/102 |
| 2003/0019755 A1* | 1/2003 | Hey | C25D 7/123 205/87 |
| 2004/0118691 A1 | 6/2004 | Kusaka et al. | |
| 2004/0187731 A1 | 9/2004 | Wang et al. | |
| 2005/0016858 A1* | 1/2005 | Barstad et al. | 205/104 |
| 2005/0157475 A1* | 7/2005 | Edwards | C25D 3/38 361/748 |
| 2008/0283405 A1* | 11/2008 | Pesika et al. | 205/135 |
| 2009/0001543 A1 | 1/2009 | Chung | |
| 2010/0255269 A1 | 10/2010 | Okamoto et al. | |

FOREIGN PATENT DOCUMENTS

| | | |
|---|---|---|
| JP | 2006045363 A * | 2/2006 |
| JP | 2006045621 A | 2/2006 |
| JP | 2009-10311 | 1/2009 |

OTHER PUBLICATIONS

Hébert Labs: Reverse Pulse Plating Controller, www.hebertlabs.com/project%20reports/electroplating%20through%20 . . . , Sep. 9, 2015.
Normal Electroplating, Reverse Pulse Electroplating.
Partial Translation of Takayama et al., Japanese Patent Application No. JP 2006-45363A, Feb. 2006.
What is Throwing Power?—Definition From Corrosionpedia, www.corrosionpedia.com/definition/1090/throwing-power, Oct. 2, 2015.

* cited by examiner

Example 1

Example 2

Example 3

Comparative Example 1

Comparative Example 2

Comparative Example 3

COPPER FILLING-UP METHOD

This application is a continuation of application Ser. No. 12/782,157, filed May 18, 2010, which in turn claims priority to JP 2009-120133 filed May 18, 2009, the entire contents of each of which is hereby incorporated by reference.

FIELD OF THE INVENTION

This invention relates to a method for filling copper in a non-through hole on a substrate.

TECHNICAL BACKGROUND

According to the Moore's law, the sizes of semiconductor devices are decreasing. The number of transistors integratable on one LSI chip has doubled in two years, and the processing performance of LSI chips is together with it exponentially improving at an annual rate of 70%. In recent years, however, limitations to the Moore's law have been pointed out. The problem pointed out is an increase in chip production cost. As the micro-processing in a production process has advanced, a mask cost and a lithography apparatus cost have been increasing, and the costs for researches and developments have been increasing. As an effective method therefor, three-dimensional assembly has been focused on, and it is highlighted as one of "More than Moore" techniques that break through the limitation of the Moore's law without relying on the decreasing of device sizes. That is, when chips are vertically stacked to make three-dimensional integration, the integration degree can be improved without relying on a cutting-edge micro-processing, and an integration degree over the Moore's law can be materialized.

The key to the three-dimensional assembly exists in the technique of electrical contacting between stacked chips. In a conventional three-dimensional assembly, the stacked chips are connected by wire bonding. The wire bonding causes a reflection noise during high-frequency signaling since the wire has a large length.

In contrast, in the three-dimensional assembly using through-silicon via electrodes (TSV), the wiring length is small, and the property of high-frequency signaling is greatly improved (for example, see Patent Document 1). As a result, the wiring length can be decreased by connecting the stacked chips at a small distance in the perpendicular direction with a through-silicone via electrode. When chips are three-dimensionally assembled using through-silicon via electrodes and are used in a device, the decrease in thickness, downsizing, higher-scale integration and higher-speed of a device can be achieved simultaneously, and most recently, such three-dimensional assemblies have been rapidly developed and practically used.

The process of making a through-silicon via electrode for use therein comprises (1) forming a non-through via hole having an unconventionally high aspect ratio (depth/opening diameter) in a silicon substrate by drying etching, (2) metallizing the silicon substrate having the via hole with copper by electroplating, and (3) applying CMP to the metalized silicon substrate to make a silicon chip having a front surface and a back surface that are connected through the via hole filled with copper that is a conductive material.

The greatest problem with the above process is in the (2) step of metallization with copper. That is, a via hole having a very high aspect ratio, e.g., an aspect ratio of 5 or more, is filled with copper, an opening portion of a via hole having a bottom is liable to be closed before the via hole is internally fully filled, and as a result, a narrow long hollow portion, i.e., a void is liable to be formed in the center portion of the via hole from the opening portion to the bottom. When a chip has such a void, highly acidic plating liquid is liable to remain in the void, and impractically, the lifetime of the chip is liable to be decreased. For preventing the formation of the void, it is effective to decrease the current density in the step of metallization with copper (e.g., 1 mA/cm$^2$, see Patent Document 2). In this case, however, there is involved a problem that the plating takes a long time (e.g., approximately 10 hours), which leads to poor productivity.

That is, with demands to develop a through-silicon via (TSV), it is required to increase the aspect ratio of vias of a silicone substrate. In this case, there are contradicting problems of the occurrence of a void and a longer time period that the plating takes. It has been hence demanded to overcome them at the same time.

PRIOR ART DOCUMENTS

Patent Document

[Patent Document 1] JP 2009-10311 A
[Patent Document 2] JP 2003-328180 A

SUMMARY OF THE INVENTION

Problems to be Solved by the Invention

Under the circumstances, it is an object of this invention to provide a method of well filling copper in a conductivity-rendered non-through hole having an aspect ratio (depth/hole diameter) of 5 or more on a substrate by the use of a specific cationic polymer for a short period of time.

Means to Solve the Problems

For achieving the above object, the present inventors have made diligent studies, and as a result, it has been found that the above object can be achieved by filling copper in a conductivity-rendered non-through hole having an aspect ratio (depth/hole diameter) of 5 or more on a substrate by periodic current reversal copper plating with an acidic copper plating bath comprising a copolymer of diallylamines and sulfur dioxide. On the basis of this finding, the present invention has been completed.

That is, this invention provides (1) a method of filling copper in a conductivity-rendered non-through hole having an aspect ratio (depth/hole diameter) of 5 or more on a substrate, the method comprising carrying out periodic current reversal copper plating with an acidic copper plating bath to fill copper in the non-through hole, the acidic copper plating bath comprising a water-soluble copper salt, sulfuric acid, chlorine ion, a brightener and a copolymer of diallylamines and sulfur dioxide, the copolymer containing a diallylamine constituent unit of the general formula (1),

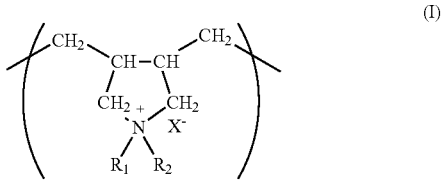

wherein each of $R_1$ and $R_2$ is independently a hydrogen atom or an alkyl group having 1 or 2 carbon atoms, and $X^-$ is a counter ion, and a sulfur dioxide constituent unit of the formula (II),

(II)

(2) a method of filling copper as recited in the above (1), wherein the acidic copper plating bath further contains a carrier, (3) a method of filling copper as recited in the above (1), wherein the substrate is a substrate comprising a silicon layer, (4) a method of filling copper as recited in the above (1) or (3), wherein the substrate is a substrate that is micro-contact-printing-treated in advance, (5) a method of filling copper as recited in any one of the above (1) to (4), wherein a current density during positive electrolysis in the periodic current reversal copper plating is 3.5 mA/cm² or more, (6) a method of filling copper as recited in the above (5), wherein a current density during reverse electrolysis in the periodic current reversal copper plating is 1 to 5 times the current density during the positive electrolysis, and (7) a method of filling copper as recited in any one of the above (1) to (6), wherein the periodic current reversal plating is set to be repeated in the order of positive electrolysis and reverse electrolysis or in the order of positive electrolysis, reverse electrolysis and a pause, the positive electrolysis is set to take a time period of 1 to 1,000 msec., the reverse electrolysis is set to take a time period of 1/100 to 1/5 times the time period of the positive electrolysis, and the pause is set to take a time period that is 0 to 3 times the time period of the positive electrolysis.

Effect of the Invention

According to this invention, periodic current reversal copper plating is carried out with an acidic copper plating bath comprising a specific cationic copolymer, whereby copper can be well filled in a conductivity-rendered non-through hole, which has an aspect ratio (depth/hole diameter) of 5 or more on a substrate for a short period of time.

PREFERRED EMBODIMENTS OF THE INVENTION

Figure 1:
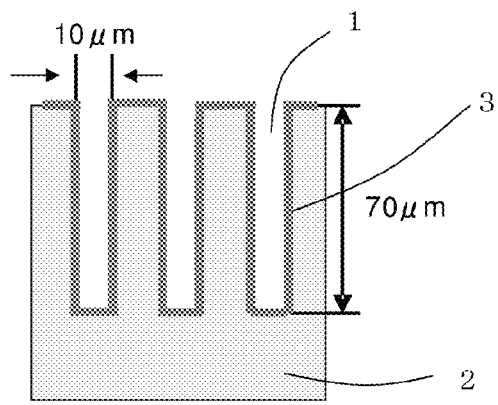
FIG. 1 is a schematic drawing of a silicon substrate having non-through holes, used in Examples.

This invention is a method of filling copper in a conductivity-rendered non-through hole having an aspect ratio (depth/hole diameter) of 5 or more on a substrate, the method comprising filling the non-through hole with copper by periodic current reversal copper plating using an acidic copper plating bath comprising a water-soluble copper salt, sulfuric acid, chlorine ion, brightener and a copolymer of the specified diallylamines and sulfur dioxide.

The water-soluble copper salt for use in the acidic copper plating bath in this invention is not specially limited so long as it is a water-soluble copper salt that is generally used in a plating bath. Examples thereof include inorganic copper salt, copper alkanesulfonate, copper alkanolsulfonate and organic acid copper salt. Examples of the inorganic copper salt include copper sulfate, copper oxide, copper chloride and copper carbonate. Examples of the copper alkanesulfonate include copper methanesulfonate, copper propanesulfonate, etc. Examples of the copper alkanolsulfonate include copper isethionate, copper propanolsulfonate, etc. Examples of the organic acid copper salt include copper acetate, copper citrate, copper tartarate, etc. These water-soluble copper salts can be used singly or may be used in combination of two or more of them, while it is preferred to use them singly from the viewpoint of concentration control.

When copper sulfate is used as a water-soluble copper salt, the concentration thereof is preferably 100 g/L or more but 300 g/L or less, more preferably 150 g/L to 250 g/L.

In this invention, the concentration of sulfuric acid in the acidic copper plating bath is preferably 10 g/L to 80 g/L, more preferably 15 g/L to 60 g/L.

In this invention, the chlorine ion concentration in the acidic copper plating bath is preferably 0.2-20 mmol/L, more preferably 0.4-10 mmol/L.

The brightener for use in the acidic copper plating bath in this invention is not specially limited so long as it is a brightener that is known to be used for filling non-through holes with copper, while examples thereof include bissulfoalkanesulfonate, sulfoalkylsulfonate, a dithiocarbamic acid derivative, and bis-(sulfoalkyl)disulfide salt. In this invention, generally, the concentration of the brightener in the acidic copper plating bath is preferably 0.1-40 mmol/L, more preferably 0.2-20 mmol/L.

The copolymer of diallylamines and sulfur dioxide for use in the acidic copper plating bath in this invention comprises a diallylamine constituent unit of the general formula (I),

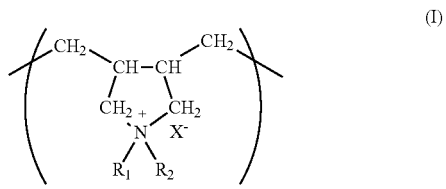

(I)

wherein each of $R_1$ and $R_2$ is independently a hydrogen atom or an alkyl group having 1 or 2 carbon atoms, and $X^-$ is a counter ion, and a sulfur dioxide constituent unit of the formula (II),

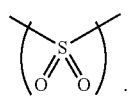

(II)

The above counter ion X⁻ in the diallylamine constituent unit of the general formula (I) includes, for example, chlorine ion, bromine ion and iodine ion.

Examples of the copolymer of diallylamines and sulfur dioxide include a copolymer of diallylmethylammonium chloride and sulfur dioxide, a copolymer of diallylmethylamine hydrochloride and sulfur dioxide, and a copolymer of diallylamine hydrochloride and sulfur dioxide. The ratio of the diallylamine constituent unit (I) and the sulfur dioxide constituent unit (II) is preferably 1:(0.1-1). The molecular weight (measured according to a GPC method using polyethylene glycol as a standard substance, i.e., a molecular weight measurement method described in JP 11-263813 A) of the copolymer of diallylamines and sulfur dioxide for use in this invention is not specially limited so long as the copolymer is water-soluble, while it is, for example, 800 to 100,000.

In this invention, the acidic copper plating bath may contain a carrier as required. The carrier is not specially limited so long as it is known to be used for filling non-through holes with copper. Examples thereof include polyethylene glycol, polypropylene glycol and a copolymer of ethylene glycol and propylene glycol. When the carrier is incorporated in this invention, generally, the concentration thereof is preferably 15 to 40 ppm.

The substrate as an object of the copper filling-up method of this invention is a substrate that has a non-through hole such as a via, etc., and that has been treated to render it conductive.

The substrate is suitably a substrate containing a silicon layer, i.e., a silicon substrate, more suitably a substrate formed mainly of a silicon layer, e.g., a substrate that contains a silicon layer that occupies, in terms of a thickness, 80% or more, more preferably 90% or more, particularly preferably substantially 100% of the substrate. There can be used a silicon substrate that has been wafer-processed and that is applicable to three-dimensional assembly.

In this invention, the aspect ratio (depth/hole diameter) of the non-through hole on the substrate is 5 or more, suitably 6 or more, particularly suitably 7 or more.

The treatment of the substrate to render it conductive is carried out by a normal method, such as electroless plating, sputtering, the adsorption of conductive fine particles, or gaseous phase plating.

The opening diameter of the non-through hole on the substrate is preferably 2 to 50 μm, particularly preferably 4 to 30 μm.

In this invention, it is preferred to apply micro-contact-printing treatment to the substrate having a non-through hole, which has been treated to render it conductive, before copper plating, since the plating time period can be shortened.

When the micro-contact-printing treatment is carried out in this invention, preferably, the flat surface of a stamp formed of an elastic material is caused to adsorb a plating-inhibiting substance and pressed on a substrate to cause the plating-inhibiting substance to be adsorbed only on the surface of the substrate having a non-through hole. The printing-inhibiting substance may be any substance that ensures that an adsorbed portion of the substrate can inhibit the inhibition of plating when it is adsorbed on the substrate. For example, an alkane thiol can be employed, while octadecanethiol is preferred since it easily forms a film when it contacts the substrate. As an elastic material forming the stamp, poly(dimethyl)siloxane (PDMS) is preferred from the viewpoint of rubbery elasticity.

When the micro-contact-printing treatment is carried out in this invention, for example, a printing-inhibiting substance is dissolved in an organic solvent, a stamp is immersed in the thus-obtained solution, then, the stamp is brought into contact with the substrate, and the substrate is washed with an organic solvent such as ethanol, or the like, or water, whereby only the plating-inhibiting substance can be transferred to the substrate surface. In this case, the plating-inhibiting substance is not to be transferred to the non-through hole of the substrate. In this invention, when the micro-contact printing treatment is carried out, a carrier such as polyethylene glycol(PEG) or the like is not used, so that the number of additive components in the plating bath is decreased, and that the concentration control is made easy, which is preferred.

In this invention, it is an essential requirement to carry out periodic current reversal copper plating. The periodic current reversal copper plating refers to a method in which copper plating is carried out while the direction of current is periodically reversed, and it is set such that the copper plating is repeated in the order of positive electrolysis and reverse electrolysis or in the order of positive electrolysis, reverse electrolysis and a pause. In this invention, since the acidic copper plating bath contains a copolymer of diallylamines and sulfur dioxide which copolymer is a specific cationic polymer, the current density during positive electrolysis can be increased, for example, to 3.5 mA/cm² or more, preferably 3.5 to 20 mA/cm², more preferably 3.5 to 8.5 mA/cm² (as an electrolysis current value, −3.5 to −8.5 mA/cm²) in spite of a high aspect ratio. As a result, the plating time period can be shortened. When the current density during positive electrolysis is too small, the plating time period gets longer. When it is too large, a void is easily formed.

In this invention, the current density during reverse electrolysis is preferably 1 to 5 times the current density during positive electrolysis. When the current density during reverse electrolysis is too small, a void is easily formed. When it is too large, plated copper is melted, and the copper plating time period is hence liable to get longer.

With regard to the period of electrolysis in the periodic current reversal, for example, the positive electrolysis time period is 1 to 1,000 msec., preferably 20 to 800 msec., more preferably 60 to 500 msec. When positive electrolysis time period is too small, ineffectively, the plating time period is liable to get longer, and when the positive electrolysis time period is too large, ineffectively, a void is liable to be formed.

In this invention, the specified cationic polymer is added, so that the positive electrolysis time period can be increased and that the plating time period can be hence decreased in spite of a high aspect ratio.

In this invention, preferably, the reverse electrolysis time period is $\frac{1}{100}$ to $\frac{1}{5}$ of the positive electrolysis time period. When the reverse electrolysis is too small, a void is liable to be formed. When it is too large, a copper plating film that is once precipitated is melted, so that the filling of a blind via hole by copper plating is liable to take a longer time.

In this invention, the pause time period is preferably 0 to 3 times the positive electrolysis time period, more preferably $\frac{1}{100}$ to twice the positive electrolysis time period.

The pause time period is, for example, 1 to 400 msec., preferably 5 to 300 msec. When the pause time period is too small, it is not sufficiently helpful to supply copper ion into a blind via hole. When it is too large, the time period required for filling a blind via hole by copper plating tends to get too long.

In this invention, the plating temperature is, for example, preferably 10 to 40° C., more preferably a room temperature between 20° C. and 25° C. When the plating temperature is too low, the plating time period is liable to get longer, and when it is too high, components in the plating bath are liable to be decomposed.

In this invention, the anode may be any anode that is conventionally used for copper sulfate plating, and any one of a soluble anode and an insoluble anode can be used.

In this invention, preferably, a plating liquid is stirred for keeping constant the concentration of plating bath components to the surface of an object to be plated. Further, it is preferred to subject a plating liquid to circulation filtering with a filter, and a foreign matter, a precipitate, etc., in the plating liquid can be thereby removed.

When a silicone substrate is used as a substrate in this invention, a non-through hole is filled with copper and then the silicon substrate is ground by CMP, etc., on the surface opposite to the surface on which the opening portion of the non-through hole is formed, whereby the forward end of the copper filled in the non-through hole can be exposed. In this manner, a silicone substrate having a feedthrough electrode can be formed. The thus-obtained silicon substrate can be used for three-dimensional assembly.

According to this invention, there is also provided another copper filling-up method different from the above copper filling-up method. The copper filling-up method is a method of filling copper in a conductivity-rendered non-through hole that has an aspect ratio (depth/hole diameter) of 2 or more, preferably 3 or more, more preferably 5 or more on a substrate, characterized in that the substrate is subjected to micro-contact-printing treatment, and the thus-treated substrate is immersed in an acidic copper plating bath comprising water-soluble copper salt, sulfuric acid, chlorine ion, a brightener and a leveler to fill copper in the non-through hole. This copper filling-up method differs from the above copper filling-up method in that this method includes the micro-contact-printing treatment as an essential step and that the plating does not essentially require the periodic current reversal.

Further, this copper filling-up method has an essential requirement that the acidic copper plating bath contains a leveler. The leveler can be selected from the above copolymer of diallylamines and sulfur dioxide, polyethyleneimine, cyanine dyes described in JP 2002-155390 A, etc., and a carrier such as polyethylene glycol (PEG) is not required, so that the concentration of the plating bath can be easily adjusted.

EXAMPLES

Examples 1-3 and Comparative Examples 1-3

Filling of Copper in Non-Through Hole on Silicon Substrate (1) Preparation of Silicon Substrate that has a Conductivity-Rendered Non-Through Hole As a substrate, a silicon substrate 2 having vias (non-through holes) 1 having an opening diameter of 10 μm and a depth of 70 μm (aspect ratio 7) as shown in FIG. 1 was used. A conductivity-rendered layer 3 was formed on the substrate by copper sputtering such that it had a thickness of 31,000 Å, whereby there was prepared a silicon substrate 2 whose treatment to render it conductive was completed. In Example and Comparative Example 1, substrates prepared in the above manner were subjected to the filling of copper by acidic copper plating.

Figure 2:
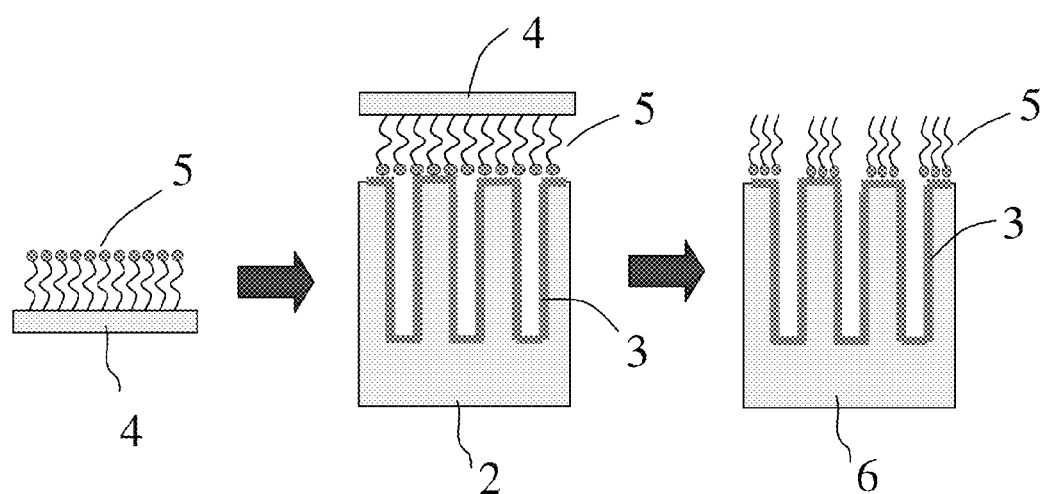
FIG. 2 is a schematic drawing when micro-contact-printing treatment is applied to a silicon substrate having non-through holes.

(2) Preparation of Silicon Substrate Treated by Micro-Contact-Printing Treatment As shown in FIG. 2, a poly(dimethylsiloxane) stamp 4 was immersed in an ethanolic solution containing 5 mmol/L of octadecanethiol (ODT) 5 as a plating-inhibiting substance for 1 minute, and dried to obtain the poly(dimethylsiloxane) stamp 4 to which ODT 5 adhered. Then, it was kept in contact with the silicon substrate 2 that had the conductivity-rendered non-through holes prepared in the above (1) for 5 seconds, to transfer ODT, and the silicon substrate 2 was ultrasonically cleaned in ethanol for 1 minute and in deionized water for 1 minute to form a self-alignment film of ODT 5 only on the surface of a convex portion, whereby there was prepared a substrate 6 whose micro-contact-printing treatment had been finished. In Examples 2 and 3 and Comparative Examples 2 and 3, substrates prepared in the above manner were subjected to the filling of copper by acidic copper plating.

(3) Method of Copper Plating

Figure 3:
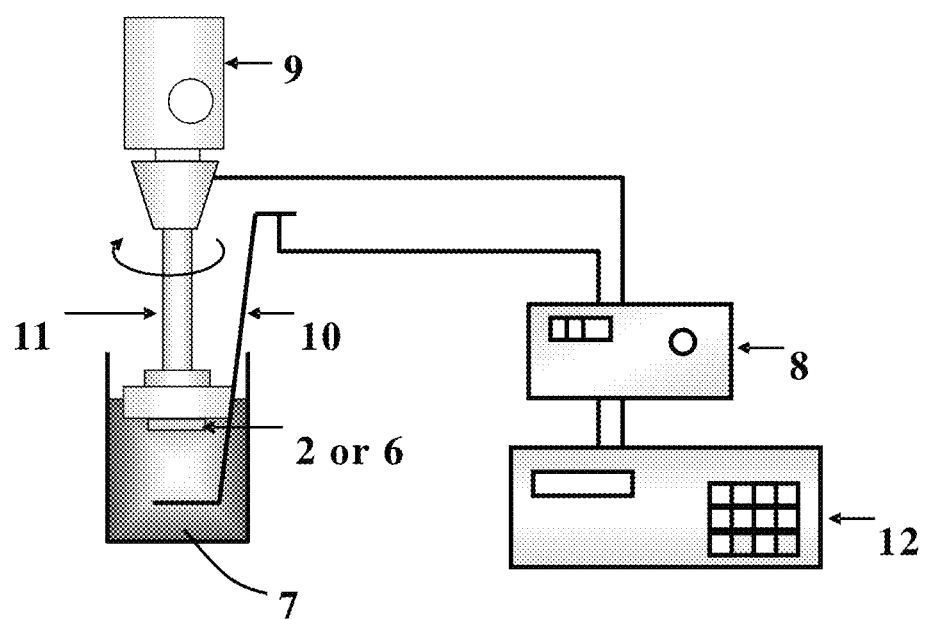
FIG. 3 is a schematic drawing of a copper plating apparatus used in Examples.

FIG. 3 shows a schematic drawing of an apparatus used for plating the silicon substrates 2 prepared in the above (1) and the silicon substrates 6 prepared in the above (2) in an acidic copper plating bath to fill copper in their non-through holes. As a power source, potentiostat/galvanostat 8 was used. The substrate 2 or 6 was attached to the bottom of a rotating disk electrode 11 and used as a cathode, and it was plated with copper in an acidic copper plating bath 7 while its rotation speed was controlled at 1,000 rpm with a rotation control unit 9. As an anode 10, phosphorus-containing copper was used. PR electrolysis (periodic current reversal electrolysis) was carried out using a pulse generator 12 under the following conditions.

(PR Electrolysis Conditions)

| Periodic current reversal electrolysis waveform | |
|---|---|
| Positive electrolysis current value ($I_{on}$) | −6 mA/cm$^2$ |
| Reverse electrolysis current value ($I_{off}$) | 12 mA/cm$^2$ |
| Positive electrolysis time period ($T_{on}$) | 200 ms |
| Reverse electrolysis time period ($T_{rev}$) | 10 ms |
| Pause time period ($T_{off}$) | 200 ms or 100 ms |

(Acidic Copper Plating Bath)

As additives, hydrochloric acid, bis-(3-sulfopropyl)disulfide (SPS), polyethylene glycol (PEG) (weight average molecular weight Mw 10,000) and a diallyldimethylammonium chloride/sulfur dioxide copolymer (P(DADMAC)/SO$_2$)) (molecular weight 4,000) were used. These were mixed with the following composition under conditions shown in Table 1 to prepare acidic copper plating baths to be used in Examples and Comparative Examples.

(Composition of Acidic Copper Plating Bath)

| | |
|---|---|
| Copper sulfate | 200 g/L |
| Sulfuric acid | 25 g/L |
| Hydrochloric acid | 70 mg/L |
| PEG (Mw 10,000) | 25 mg/L (Example 1 and Comparative Example 1) or 0 mg/L (Examples 2 and 3 and Comparative Examples 2 and 3) |
| SPS | 2 ppm |
| P(DADMAC/SO$_2$) | 1 mg/L (Examples 1, 2 and 3) or 0 mg/L (Comparative Examples 1, 2 and 3) |

(Via Fill Plating Conditions)

| | |
|---|---|
| Bath temperature | room temperature |
| Stirring speed | 1,000 rpm (based on rotating disk electrode) |

-continued

| Anode | Phosphorus-containing copper |
| Replacement with oxygen | 0.5 L/min., 50 min. (per 300 ml of the plating liquid) |

(4) Results

Figure 4:
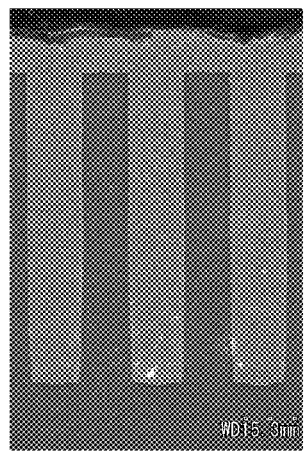
FIG. 4 shows photographs of cross sections taken through a scanning electron microscope (FESEM S-4300, supplied by Hitachi, Ltd.) with regard to silicon substrates plated with copper in Examples 1 to 3 and Comparative Examples 1 to 3.
Figure 4:
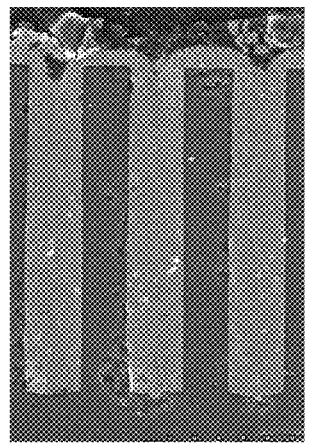
Figure 4:
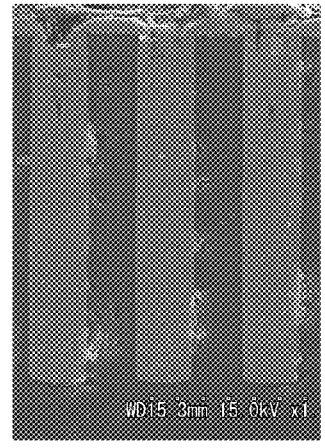
Figure 4:
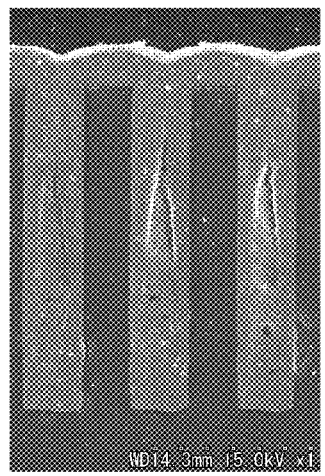
Figure 4:
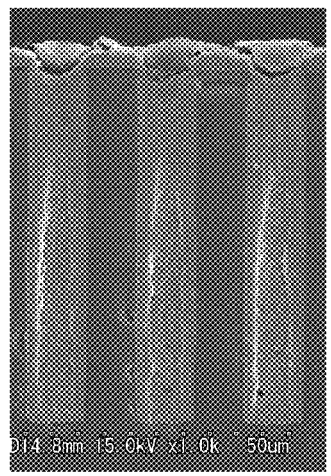
Figure 4:
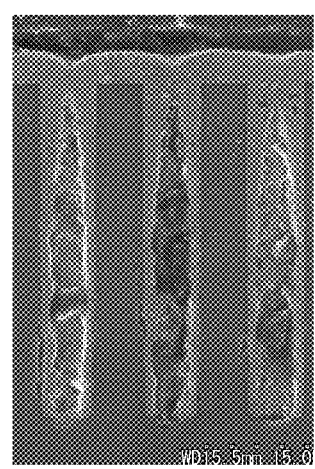

After completion of the plating with copper, for evaluating the state of filling copper in the via holes (non-through holes), the via hole openings were cut, and the cross-sections were mirror-polished and observed through a scanning electron microscope (FESEM S-4300, supplied by Hitachi, Ltd.). Table 1 shows the evaluation results. Further, FIG. 4 shows photographs of the thus-obtained cross sections. As shown in Table 1 and FIG. 4, it was found that in Examples 1 to 3 wherein the periodic current reversal copper plating was carried out using acidic copper plating baths containing P(DADMAC/$SO_2$) that was a cationic polymer, no void was formed and the copper filling-up proceeded for a short period of time.

In contrast, it was found that in Comparative Examples 1 to 3 where the periodic current reversal copper plating was carried out using acidic copper plating baths containing no P(DADMAC/$SO_2$) that was a cationic polymer, it was found that voids were formed.

TABLE 1

(Evaluation results)

| | Experimental conditions | | | | Experimental results | |
|---|---|---|---|---|---|---|
| | P(DADMAC)/$SO_2$ (mg/L) | PEG (ppm) | μCP treatment | Pause time period of PR electrolysis (msec) | Plating time period (min) | Filling up of hole | Ratio of void in copper filled |
| Ex. 1 | 1 | 25 | No | 200 | 75 | CF | 0 |
| Ex. 2 | 1 | 0 | Yes | 200 | 50 | CF | 0 |
| Ex. 3 | 1 | 0 | Yes | 100 | 37 | CF | 0 |
| CEx. 1 | 0 | 25 | No | 200 | 75 | Void | 1/10 |
| CEx. 2 | 0 | 0 | Yes | 200 | 50 | Void | 1/4 |
| CEx. 3 | 0 | 0 | Yes | 200 | 25 | Void | 1/2 |

Ex. = Example,
CEx. = Comparative Example.
CF = Completely filled,
Void = Void was formed.

INDUSTRIAL UTILITY

According to this invention, the periodic current reversal copper plating is carried out using an acidic copper plating bath containing the specified cationic polymer, whereby copper can be well filled in a conductivity-rendered non-through hole having an aspect ratio (depth/hole diameter) of 5 or more on a substrate in a short period of time.

EXPLANATION OF SYMBOLS

1. Via (non-through hole)
2. Silicon substrate
3. conductivity-rendered layer
4. Poly(dimethylsiloxane) stamp
5. Plating-inhibiting substance: Octadecanethiol
6. Substrate treated by micro-contact-printing
7. Acidic copper plating bath
8. Potentiostat/galvanostat
9. Rotation control unit
10. Anode
11. Rotating disk electrode
12. Pulse generator

The invention claimed is:

1. A method of completely filling copper in a conductivity-rendered non-through hole having an aspect ratio (depth/hole diameter) of 5 or more on a substrate, the method comprising carrying out periodic current reversal copper plating with an acidic copper plating bath to completely fill copper in the non-through hole without a void in the copper after filling, wherein the periodic current reversal plating is set to be repeated in the order of positive electrolysis and reverse electrolysis or in the order of positive electrolysis, reverse electrolysis, and pause, the positive electrolysis is set to take a time period of 60 to 500 msec., the reverse electrolysis is set to take a time period of 1/100 to 1/5 times the time period of the positive electrolysis, and the pause is set to take a time period of 5 to 300 msec., and wherein the acidic copper plating bath comprises a water-soluble copper salt, sulfuric acid, chlorine ion, a brightener and a copolymer of diallylamines and sulfur dioxide, the copolymer containing a diallylamine constituent unit of the general formula (I),

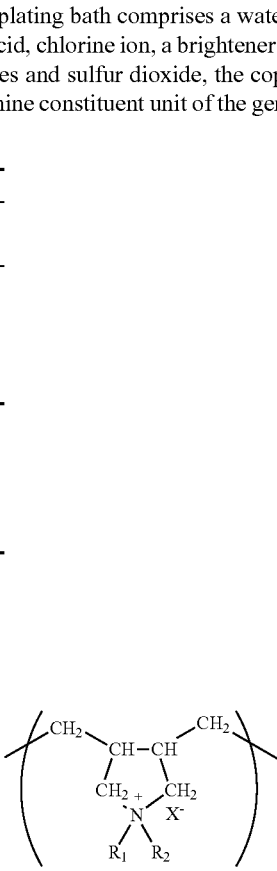

wherein each of $R_1$ and $R_2$ is independently a hydrogen atom or an alkyl group having 1 or 2 carbon atoms, and $X^-$ is a chlorine, a bromine or an iodine ion, and a sulfur dioxide constituent unit of the formula (II),

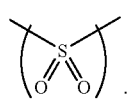

2. The method of completely filling copper as recited in claim 1, wherein the acidic copper plating bath further contains a carrier.

3. The method of completely filling copper as recited in claim 1, wherein the substrate is a substrate comprising a silicon layer.

4. The method of completely filling copper as recited claim 1, wherein the substrate is a substrate that is micro-contact-printing-treated in advance.

5. The method of completely filling copper as recited in claim 1, wherein a current density during positive electrolysis in the periodic current reversal copper plating is 3.5 mA/cm$^2$ or more.

6. The method of completely filling copper as recited in claim 5, wherein a current density during reverse electrolysis in the periodic current reversal copper plating is 1 to 5 times the current density during the positive electrolysis.

* * * * *